(12) United States Patent
Gopinath et al.

(10) Patent No.: US 10,777,268 B2
(45) Date of Patent: Sep. 15, 2020

(54) STATIC RANDOM ACCESS MEMORIES WITH PROGRAMMABLE IMPEDANCE ELEMENTS AND METHODS AND DEVICES INCLUDING THE SAME

(71) Applicant: Adesto Technologies Corporation, Santa Clara, CA (US)

(72) Inventors: Venkatesh P. Gopinath, Fremont, CA (US); Nathan Gonzales, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 16/188,224

(22) Filed: Nov. 12, 2018

(65) Prior Publication Data

US 2019/0348112 A1 Nov. 14, 2019

Related U.S. Application Data

(63) Continuation of application No. PCT/US2016/032428, filed on May 13, 2016.

(51) Int. Cl.
*G11C 13/00* (2006.01)
*G11C 11/412* (2006.01)
*G11C 14/00* (2006.01)

(52) U.S. Cl.
CPC ........ *G11C 13/0026* (2013.01); *G11C 11/412* (2013.01); *G11C 13/0028* (2013.01); *G11C 14/009* (2013.01)

(58) Field of Classification Search
CPC .............. G11C 13/0026; G11C 11/412; G11C 13/0028; G11C 14/009
See application file for complete search history.

(56) References Cited

U.S. PATENT DOCUMENTS

| 5,761,115 | A | 6/1998 | Kozicki et al. |
| 6,487,106 | B1 | 11/2002 | Kozicki |
| 6,635,914 | B2 | 10/2003 | Kozicki et al. |
| 6,944,050 | B2 * | 9/2005 | Kang ............... G11C 11/412 365/154 |
| 7,079,415 | B2 * | 7/2006 | Frey ............... G11C 11/16 365/171 |
| 7,436,694 | B2 * | 10/2008 | Berthold ........... G11C 13/0004 365/100 |

(Continued)

OTHER PUBLICATIONS

International Search Report and Written Opinion of the International Searching Authority for International application No. PCT/US16/32428, dated Sep. 14, 2016.

*Primary Examiner* — Tri M Hoang

(57) ABSTRACT

An integrated circuit (IC) device can include static random access memory (SRAM) cells that each include a pair of latching devices, and first and second resistive elements disposed over the latching devices. The first resistive element can be conductively connected to a first data latching node by a first vertical connection. The second resistive element can be conductively connected to a second data latching node by a second vertical connection. Each resistive element can include at least one memory layer that is capable of being programmed between at least a high and lower resistance state by application of electric fields, the resistive elements having only the high resistance state.

20 Claims, 5 Drawing Sheets

(56) References Cited

U.S. PATENT DOCUMENTS

| | | | |
|---|---|---|---|
| 7,599,210 B2 * | 10/2009 | Okazaki | G11C 11/412 365/148 |
| 7,760,538 B1 * | 7/2010 | Paak | G11C 11/412 365/148 |
| 8,687,403 B1 * | 4/2014 | Derhacobian | G11C 13/0007 365/148 |
| 8,947,913 B1 * | 2/2015 | Derhacobian | G11C 13/0011 365/148 |
| 9,330,755 B1 | 5/2016 | Van Buskirk | |
| 2006/0181916 A1 | 8/2006 | Roehr | |

* cited by examiner

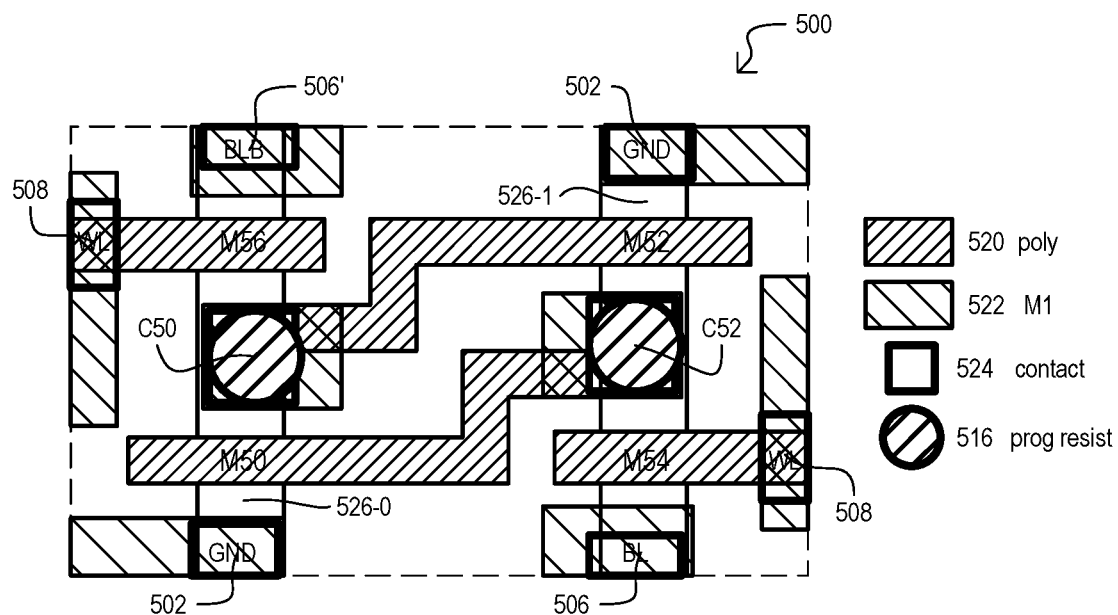
FIG. 5
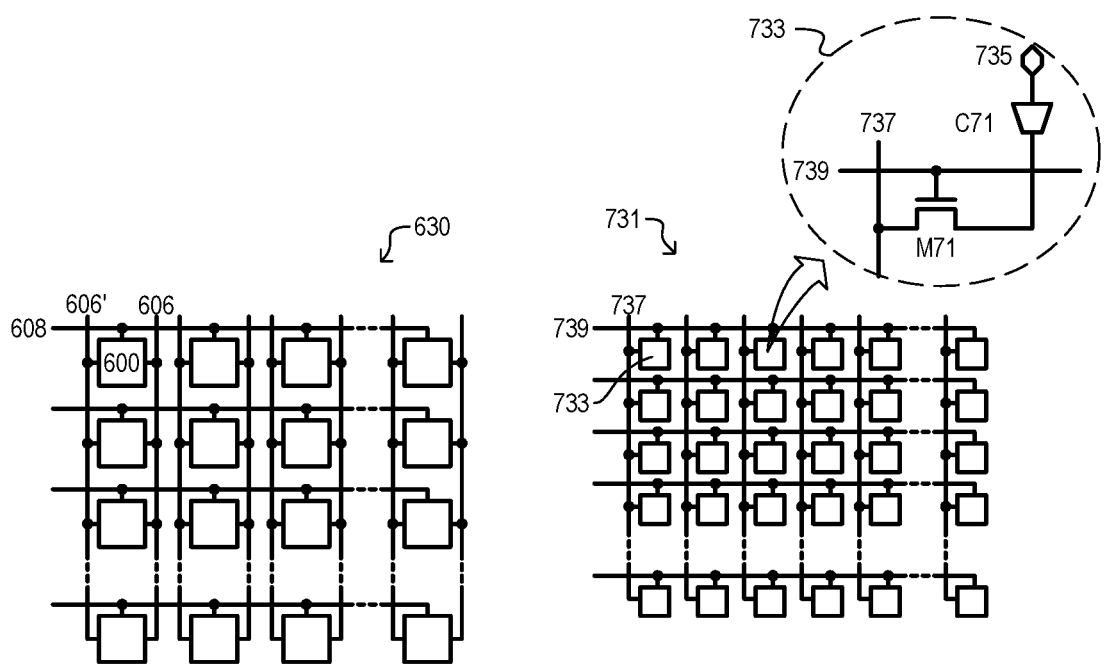
FIG. 6
FIG. 7

(BACKGROUND)

(BACKGROUND)

(BACKGROUND)

STATIC RANDOM ACCESS MEMORIES WITH PROGRAMMABLE IMPEDANCE ELEMENTS AND METHODS AND DEVICES INCLUDING THE SAME

PRIORITY CLAIMS

This application is a continuation of Patent Cooperation Treaty (PCT) Application No. PCT/US2016/032428 filed May 13, 2016, the contents of which are incorporated by reference herein.

TECHNICAL FIELD

The present disclosure relates generally to integrated circuits (ICs) that include static random access memories (SRAMs), and more particularly to ICs that can utilize programmable resistance elements as pull-up resistors in SRAM cells.

BACKGROUND

Static random access memory (SRAM) cells can have rapid access times, as compared to other memory types, and so can serve as important storage elements in integrated circuit devices. Various conventional SRAM cells are known. FIG. 10A shows a conventional six transistor (6T) SRAM cell 1001, which can include n-channel and p-channel transistors pairs (M101/M103, M105/M107) each in a CMOS inverter configuration. The CMOS inverters are cross-coupled between two nodes (N100, N101) to form a latch. Thus, nodes N100/N101 will be latched at complementary values (i.e., N100 high, N101 low, or vice versa). 6T SRAM cell 1001 also includes two access transistors M109/M111 which connect nodes N100/N101 to bit lines BLB and BL, respectively.

FIG. 10B shows an integrated circuit layout for a 6T SRAM cell like that of FIG. 10A. Like items are identified with the same reference characters. Because a 6T SRAM has both p-channel (i.e., latch pull-up) transistors and n-channel (i.e., latch pull-down) transistors, the memory cell can require substrate portions of different conductivity types (e.g., n-well for p-channel devices). As a result, a conventional 6T SRAM cell requires that some area be dedicated to well isolation or other similar structures.

Other SRAM cells are also known.

FIG. 11 shows a conventional four transistor (4T) SRAM cell 1101, which can include an n-channel transistors pair (M111/M113) cross-coupled between two nodes (N110, N111), as well as two pull-up resistors R111 and R113. Pull-up resistors (R111/R113) can be connected between the nodes N110/N111, respectively, and a power supply voltage VDD. In this arrangement, nodes N110/N111 can be latched between complementary values. Conventional 4T SRAM cell 1101 can also include two access transistors M115/M117 which connect nodes N110/N111 to bit lines BLB and BL, respectively. Pull-up resistors R111/R113 are typically patterned from a layer of polysilicon.

While conventional 4T SRAM cell 1101 can provide a more compact cell size than a 6T SRAM cell, if the pull-up resistors (R111/R113) are made from the same layer as the transistor gates additional spacing constraints can be imposed on the cell. Further, polysilicon pull-up resistors can require additional processing steps, such as doping in order to increase their resistance. Still further, polysilicon resistors can require additional process steps and/or complexity, such as a dual polysilicon process and/or the use of "buried" contacts to connect pull-up resistors to substrate areas.

BRIEF DESCRIPTION OF DRAWINGS

FIG. 5 is a plan view of a SRAM cell according to one particular embodiment.

FIG. 6 is a block schematic diagram of a SRAM array according to an embodiment.

FIG. 7 is a block schematic diagram of a resistive random access memory (RRAM) array that can be included in embodiments.

DETAILED DESCRIPTION OF THE EMBODIMENTS

Embodiments can include static random access memory (SRAM) cells, SRAM arrays, integrated circuit devices including SRAM cells, and related methods in which SRAM cells include pull-up resistors formed all, or in part, by programmable resistance elements.

In some embodiments the programmable resistance elements are fabricated in a high resistance (e.g., unprogrammed) state and remain unprogrammed to provide high resistance pull-up resistors for SRAM cells.

In some embodiments the programmable resistance elements are formed on a fabrication layer above a gate layer, and thus pull-up resistors may only require the space of a contact in the area occupied by an SRAM cell.

In some embodiments an integrated circuit (IC) device can include SRAM cells with pull-up resistors formed with programmable resistance elements, as well as nonvolatile storage cells that include programmable resistance elements as nonvolatile storage elements. The programmable resistance elements of the SRAM cells are maintained in the high resistance state, while the programmable resistance elements of the nonvolatile storage cells are programmed between two or more resistance states to store data.

In some embodiments an IC device can include programmable resistance elements having at least three vertically stacked layers, with groups of programmable resistance elements having a top layer formed by, or conductively connected to, horizontally disposed plate structures. Some of the programmable resistance elements can be pull-up resistors for SRAM cells, and connected to a same plate structure, which can be maintained at a predetermined voltage to latch data in the SRAM cells. Other of the programmable resistance elements can be storage elements of nonvolatile memory cells connected to plate structures that can be driven to different voltages to program programmable resistance elements between resistance states. Thus, an IC device can include one or more SRAM plate structures that are maintained at a constant voltage while data are stored in the SRAM cells, as well as multiple nonvolatile memory plate structures that can be driven between different voltages to store data in nonvolatile memory cells.

In some embodiments programmable resistance elements can be capable of being programmed between different resistance states by the application of electric fields which induce an oxidation-reduction reaction to cause changes in resistance.

In particular embodiments programmable resistance elements can be conductive bridging random access memory (CBRAM) type elements.

Figure 1:
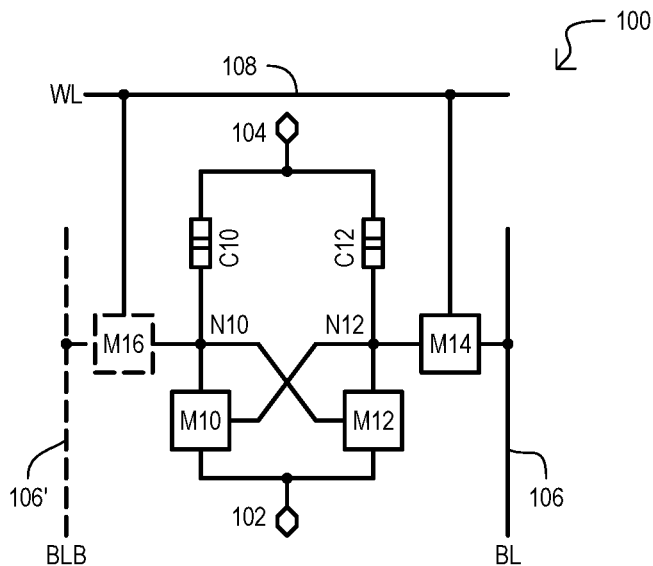
FIG. 1 is a block schematic diagram of a static random access memory (SRAM) cell according to an embodiment.

FIG. 1 is a block schematic diagram of a SRAM cell 100 according to an embodiment. SRAM cell 100 can include latching devices M10, M12, resistance elements (C10, C12), an access device M14, a word line 108, and bit line 106. Latching devices M10/M12 can each be three terminal devices having controllable current paths and control nodes. Latching devices M10/M12 can be cross-coupled between data storage nodes N10 and N12, with latching device M10 having a control terminal connected to node N12 and a first current path terminal connected to node N10, and latching device M12 having a control terminal connected to node N10 and a first current path terminal connected to node N12. Second current path terminals for both latching devices M10/M12 can be commonly connected to a first voltage node 102. In some embodiments, latching devices M10/M12 can be transistors.

Resistance element C10 can be a two-terminal element connected between data storage node N10 and a second voltage node 104. Resistance element C12 can be a two-terminal element connected between data storage node N12 and second voltage node 104. Resistance elements C10/C12 are capable of being programmed between two or more different resistance states, but according to some embodiments, are maintained in a high resistance state during data storage operations, to thus serve as pull-up resistors in the SRAM cell 100. Thus, in some embodiments, resistance elements C10/C12 are fabricated to have an initial high resistance state or are initially programmed to a high resistance state. While the resistance elements C10/C12 are capable of being programmed to a low resistance state, they are never programmed to a low resistance state, or are not so programmed while the SRAM cell 100 is to operate as a data storage cell.

In particular embodiments, resistance elements C10/C12 can be two terminal elements having one or more layers that are programmable between two or more resistance states by application of electric fields. In some embodiments, application of electric fields can induce an oxidation-reduction reaction that can result in changes in resistance. In particular embodiments, a layer can be programmable by ion conduction induced by application of electric fields. In addition or alternatively, resistance elements C10/C12 can be formed by vertically stacked layers, including one or more programmable resistance layers.

Referring still to FIG. 1, an access device M14 can be a three terminal device having a controllable current path connected between a data storage node (in this example N12) and a bit line 106. Access device M14 can also have a control node connected to word line 108. Optionally, SRAM cell 100 can include a second access device M16 having a controllable current path connected between the other data storage node (in this example N10) and a bit line 106', and can have a control node connected to word line 108. In such an arrangement bit lines 106/106' are understood to carry complementary values (e.g., high and low).

In a write operation, first and second voltage nodes 102/104 are driven to suitable supply voltages. A bit line (e.g., 106) can be driven to a high or low voltage depending upon a data value to be stored (or two bit lines 106/106' driven to complementary values). Word line 108 can then be activated to turn on access device M14 (or access devices M14/M16) and the voltages on bit line(s) will drive storage nodes N10/N12 to latch the data value. In a read operation, word line 108 can be activated to turn on M14 (or M14/M16) and the bit line(s) will "split" (be driven toward different voltages). Such a split can be amplified to generate an output read voltage.

It is understood that first and second voltage nodes 102/104 can change according to operation (higher difference for faster operation, lower difference to reduce power consumption, and/or both to same voltage to disable the SRAM cell, etc.).

Figure 2:
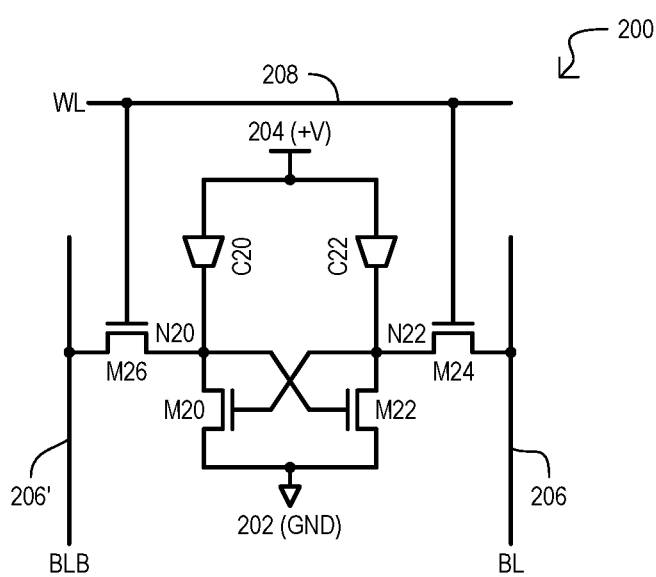
FIG. 2 is a schematic diagram of a SRAM cell according to another embodiment.

FIG. 2 is a schematic diagram of a four transistor (4T) SRAM cell 200 according to a particular embodiment. In a particular embodiment, SRAM cell 200 can be one very particular implementation of that shown in FIG. 1.

SRAM cell 200 can include a configuration like that of FIG. 1, however, latching devices M20/M22 can be n-channel insulated gate field effect transistors (referred to herein as MOS type transistors, but not indicating any particular gate insulator type). Transistors M20/M22 can have cross-coupled gates and drains, with sources commonly connected to a first (e.g., low) voltage node 202. SRAM cell 200 can also include two access devices M24/M26, which can also be n-channel MOS type transistors, connected to complementary bit lines 206/206'. Gates of access transistors M24/M26 can be commonly connected to word line 208.

In the embodiment of FIG. 2, resistance elements C20/C22 can be CBRAM type elements having anode terminals commonly connected to a second (e.g., high) voltage node 204 and cathode terminals connected to storage nodes N20/N22, respectively. In some embodiments, an anode terminal can include one or more elements that are ion conductible in a memory layer of the CBRAM type element. Further, in some elements, changes in conduction in a memory layer can be brought about by the formation of conductive paths through a memory layer by the ion conduction of one or more metals, semi-metals, or semiconductors.

An embodiment like that of FIG. 2 can include latching devices M20/M22 and access devices M24/M26 formed by transistors of the same conductivity type. Thus, a cell size can be advantageously compact as a layout will not require well isolation structures or the like. However, alternate embodiments can include transistors of different conductivity types. For example, latching transistors can be n-channel MOS type transistors, while access transistor(s) can be p-channel MOS type transistors, or vice versa. Further, while FIG. 2 shows an SRAM cell 200 with n-channel transistors, an alternate embodiment can include all p-channel MOS type transistors. In embodiments with p-channel latching transistors, such latching transistors can have cross-coupled gates and drains, with sources commonly connected to a high voltage node, and pull-up resistance elements can be connected between storage nodes and a low voltage node.

Figure 3:
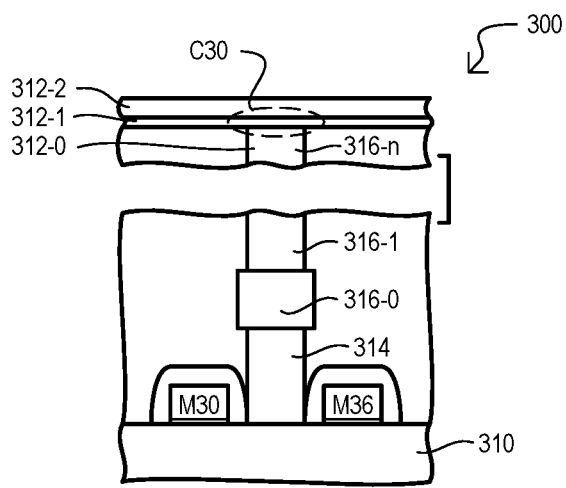
FIG. 3 is a side cross sectional view of a SRAM cell according to an embodiment.

FIG. 3 is a side cross sectional view of a portion of a SRAM cell 300 according to one particular embodiment. FIG. 3 shows how a programmable resistance element serving as a pull-up resistor can be formed over a substrate and connected to transistors of the SRAM cell by one or more vertical interconnect layers. FIG. 3 shows two transistors M30/M36 formed in a substrate 310. Transistors M30/M36 can be MOS type transistors of an SRAM cell according to any of the embodiments described herein or equivalents. In a particular embodiment, one transistor (e.g., M30) can be a latching transistor, while the other transistor (e.g., M36) can be an access transistor. Alternate embodiments can include transistor types other than MOS transistors. Further, while FIG. 3 shows a MOS type transistors having a channel in a uniformly flat substrate, alternate embodiments can include MOS type transistors including different orientations, including "FinFET" type transistors, or the like.

A programmable resistance element C30 can be formed over substrate 310, and connected to transistors M30/M36 by a conductive path. In such an arrangement, each pull-up resistor in an SRAM layout can only require the areas of a contact at lower levels. In FIG. 3, a conductive connection between programmable resistance element C30 and substrate 310 can include a contact 314 and a number of other conductive structures 316-0 to 316-n, such as vias (vertical connections) and metallization patterns (portions of a larger lateral interconnection layer). While FIG. 3 shows a relatively straight vertical connection, in other embodiments, connections can have segments that move in a lateral direction.

In the embodiment shown, a programmable resistance element C30 can be formed by a vertical arrangement of layers, including one or more programmable layers 312-1 formed between a first (bottom) electrode 312-0 and a second (top) electrode 312-2. In the embodiment shown, a bottom electrode 312-0 can be formed, all or in part, by a conductive structure 316-n (i.e., a via or metallization pattern). In some embodiments, programmable layer(s) 312-1 and/or second electrode 312-2 can extend, not only over SRAM cell 300, but over multiple such SRAM cells (e.g., extend over an SRAM array or a portion of an array). A second electrode 312-2 that extends over multiple SRAM cells can be commonly connected to multiple programmable resistance elements, and thus can serve as a "plate" structure, as will be described in embodiments below. However, while FIG. 3 shows programmable layer(s) 312-1 and second electrode 312-2 extending over a SRAM cell, in other embodiments, programmable resistance elements can have a confined structure, being separate structures from one another. Additionally, while FIG. 3 shows a programmable resistance element having vertical layers, alternate embodiments can include programmable resistance elements having one or more layers with other orientations with respect to one another.

For some embodiments, programmable resistance elements used as pull-up resistors can have a resistance between about 10 MΩ and 10 GΩ without requiring polysilicon resistors. In particular embodiments, such programmable resistance elements can be CBRAM type elements formed well above the substrate after all, or most, metallization layers have been formed. The CBRAM elements can reliably provide a high resistance (e.g., between about 10 MΩ and 10 GΩ) for good pull-up resistor performance.

Figure 4A:
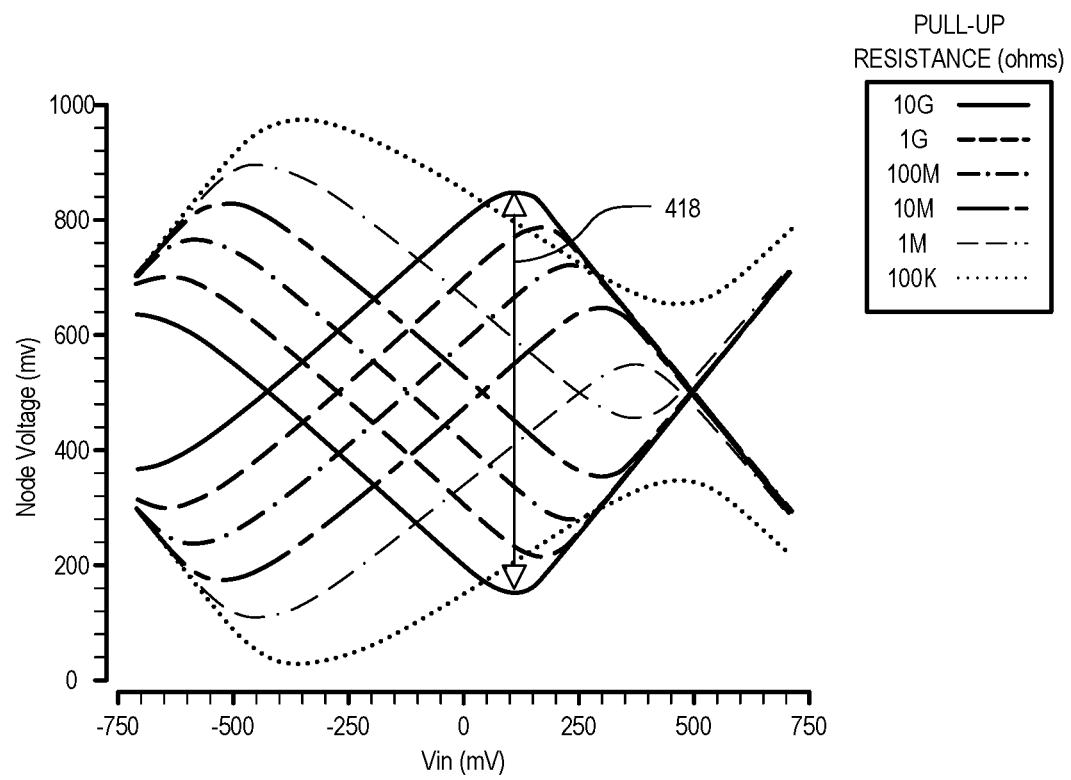
FIGS. 4A and 4B are simulation results for a SRAM cell like that shown in FIG. 2.

FIG. 4A is a diagram showing simulation results examining the signal noise margin (SNM) for a 4T SRAM cell like that of FIG. 2. FIG. 4A shows SRAM cell SNM for pull-up resistors of different values (100 kΩ, 1 MΩ, 10 MΩ, 100 MΩ, 1 GΩ and 10 GΩ) and a power supply of one volt. SNM can be calculated from the distance between the two switching curves (which can represent the two load/transistor pairs that drive the storage node). As shown, a pull-up resistance of 10 GΩ (shown by arrow 418) can provide the greatest SNM from among the resistance values. For some applications, SNM can be unacceptably low at resistances of about 1M and below.

Figure 4B:
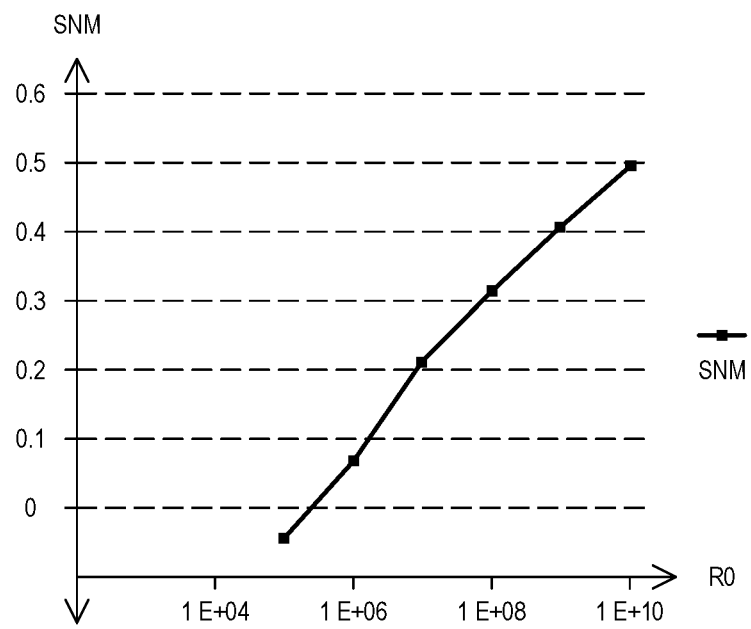

FIG. 4B is a diagram showing SNM versus pull-up resistance for a SRAM cell like that of FIG. 2. For many applications, an SNM greater than 200 mV can provide good performance. As shown, pull-up resistances of about 10 MΩ or greater can deliver a SNM greater than 200 mV.

From FIGS. 4A and 4B, it is shown that pull-up resistors formed from programmable resistance elements having a resistance greater than 10 MΩ can provide good SRAM cell performance. Further, when embodiments include CBRAMs, SRAM cells can have broad process stability, providing good SNM over a wide range of expected CBRAM resistance (e.g., 10 MΩ and 10 GΩ).

Figure 10A:
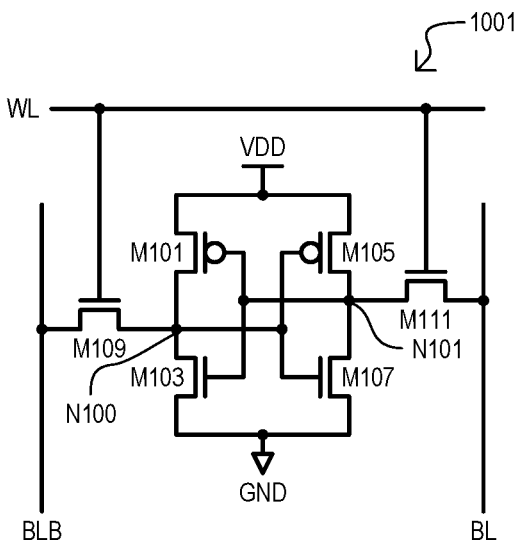
FIGS. 10A and 10B are diagrams showing a conventional six transistor SRAM cell.
Figure 11:
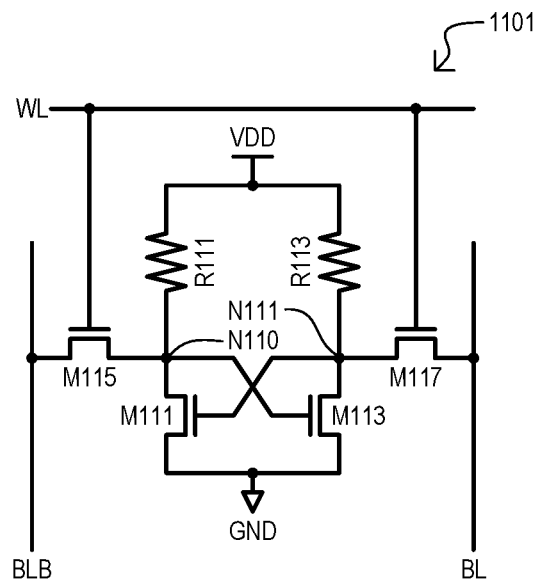
FIG. 11 is a diagrams of a conventional four transistor SRAM cell.
Figure 10B:
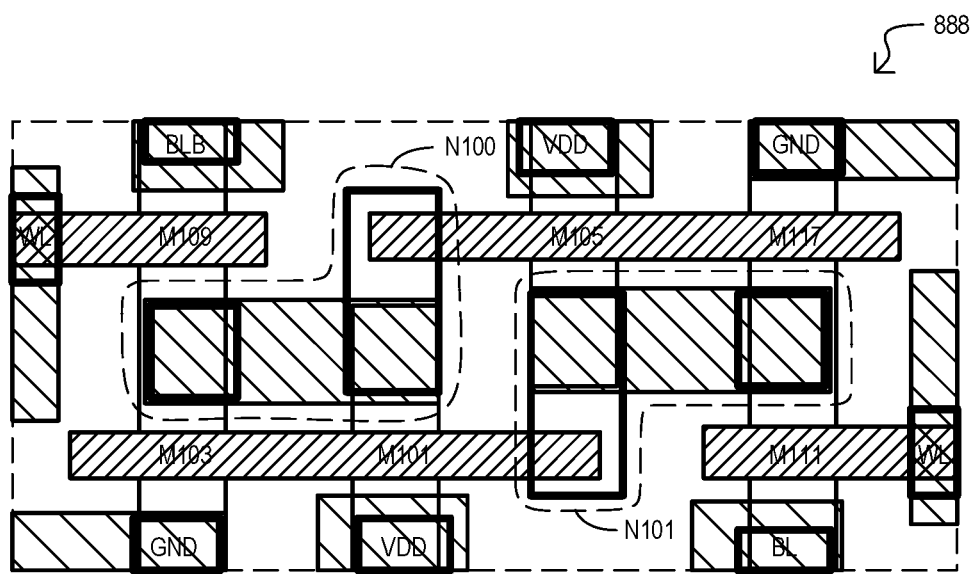

It is noted that in a conventional six transistor (6T) SRAM cell, like that of FIG. 10A, p-channel pull-up transistors (e.g., M101 or M105) have a leakage current when in operation. As but one very particular example, for a transistor having width/length (W/L) dimensions of 0.9/0.036 μm, at a power supply of 1.32V, and a temperature range of 25° C. to 125° C., a leakage current can range from about 0.2 nA to 5.0 nA. In contrast, a 10 GΩ resistor, such as a CBRAM serving as a pull-up resistor, can have a leakage current of about 0.1 nA. Accordingly, a 4T transistor according to embodiments can have low leakage currents, for advantageously low power consumption.

FIG. 5 is a top plan view of a SRAM cell 500 according to one, very particular embodiment. In one arrangement, SRAM cell 500 can be one implementation of that shown in FIG. 2. FIG. 5 shows a polysilicon layer 520, a metallization layer 522, contacts 524, and the location of programmable resistance elements 516. As shown, latching devices M50/M52 and access devices M54/M56 can be MOS type transistors formed with a polysilicon layer 520. In some embodiments, latching and access devices (M50 to M56) can be transistors of the same conductivity type, and thus not require well isolation.

Contacts 524 can extend upward from active areas 526-0/1 to metallization layers 522, and eventually to bit lines 506/506', voltage node 502, a word line 508, and programmable resistance elements C50/C52. As shown, area for programmable resistance elements C50/C52 at this level can include only a contact, allowing for a compact cell size.

It is understood that FIG. 5 represents but one very particular layout for a 4T SRAM cell, and should not be construed as limiting. Embodiments can include any suitable SRAM cell that employs pull-up (or pull-down) resistors.

FIG. 6 is a block schematic diagram of a SRAM cell array 630 according to an embodiment. SRAM cell array 630 can include SRAM memory cells (one shown as 600) arranged into rows and columns. Rows of SRAM memory cells can be commonly connected to a same word line (one shown as 608). Columns of SRAM memory cells can be commonly connected to a same bit line pair (one pair shown as 606/606'). SRAM memory cells (e.g., 600) can take of the form of any of those described in embodiments herein, or equivalents. Accordingly, while FIG. 6 shows columns of SRAM cells connected to bit line pairs, alternate embodiment can include columns of SRAM cells connected to single bit lines.

While embodiments can include SRAM cells and arrays, embodiments can also include integrated circuit (IC) devices that advantageously incorporate such SRAM cells and/or SRAM arrays with other circuits. In some embodiments, such other circuits can include resistive random access memory (RRAM) type memory arrays that include programmable resistance elements that are programmed between different resistance states to store data. Such RRAM type cells can be nonvolatile memory cells. FIG. 7 is one example of such a RRAM array.

FIG. 7 is a block schematic diagram of a RRAM array 731 that can be included in embodiments. RRAM array 731 can include RRAM memory cells (one shown as 733) arranged into rows and columns. Rows of RRAM memory cells can be commonly connected to a same word line (one shown as 739). Columns of RRAM memory cells can be commonly connected to a same bit line (one shown as 737).

FIG. 7 shows one example of a conventional RRAM cell 733. RRAM cell 733 can include a transistor M71 having a source-drain path connected between a bit line 737 and a first terminal programmable resistance element C71. A second terminal of programmable resistance element C71 can be connected to node 735. Node 735 can be a plate node common to multiple RRAM cells.

While FIG. 7 shows an RRAM array 733 having a one-transistor one-resistor (1T-1R) type cell, alternate embodiments can include any suitable RRAM array configuration, including but not limited to "cross-point" array architectures, that do not include access devices.

FIG. 8A to 8D are a series of top plan views showing methods of fabricating an IC device according to an embodiment.

Figure 8A:
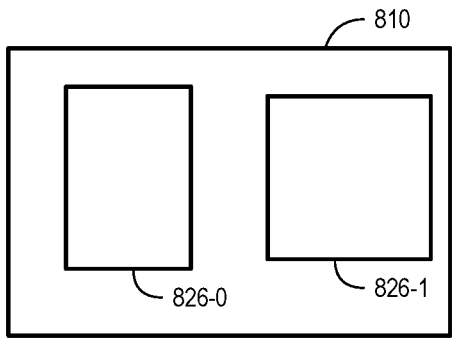
FIGS. 8A to 8D are a series of top plan views showing a method of making an integrated circuit (IC) according to an embodiment.
Figure 9A:
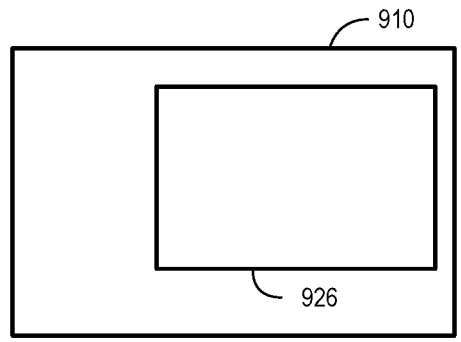
FIGS. 9A to 9D are a series of top plan views showing a method of making an IC according to another embodiment.

In FIG. 8A, separate active regions 826-0/1 can be formed in a substrate 810.

Figure 8B:
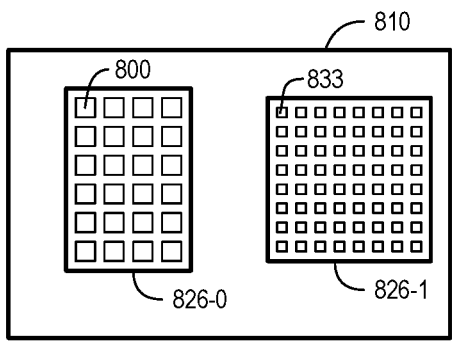

In FIG. 8B, SRAM cells (one shown as 800) can be formed in active region 826-0. SRAM cells can take the form of any of those shown herein, or equivalents, in which programmable resistance elements have a top electrode. RRAM cells (one shown as 833) can be formed in the other active region 826-1. RRAM cells can take the form of any of those shown herein, or equivalents, but can also have programmable resistance elements have a top electrode. In particular embodiments, programmable resistance elements for SRAM cells (e.g., serving as pull-up resistors) can be the same as those for RRAM cells.

Figure 8C:
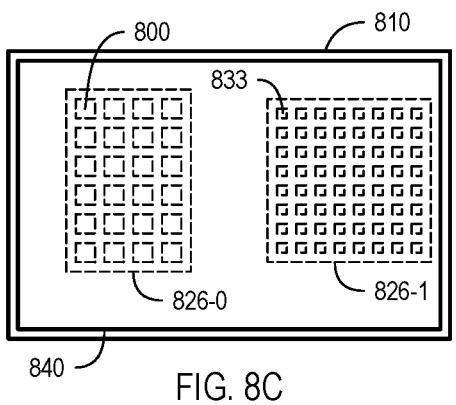
Figure 9C:
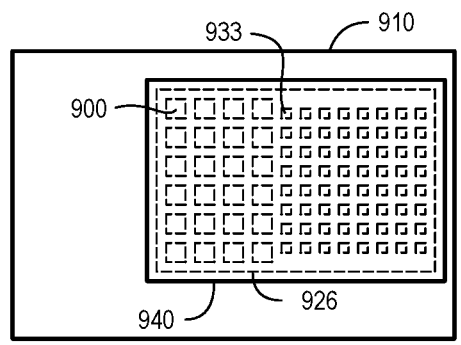

In FIG. 8C a plate layer 840 can be formed over SRAM cells and RRAM cells. A plate layer 840 can have a conductive connection to programmable resistance elements in each SRAM cell and RRAM cell. In some embodiments, a plate layer 840 can form, or can be conductively connected to, a terminal of two programmable resistance elements serving as pull-up resistors in each 4T SRAM cell, while at the same time forming, or providing a conductive connection to, terminals of programmable resistance elements in RRAM cells. In particular embodiments, a first plate layer 840 can form, or can be conductively connected to, an anode of CBRAM type elements serving as pull-up resistors in 4T SRAM cell and as storage elements in RRAM cells.

Figure 8D:
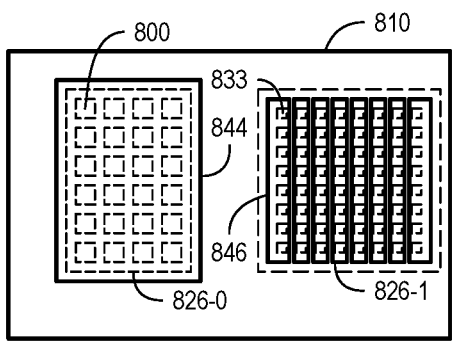
Figure 9D:
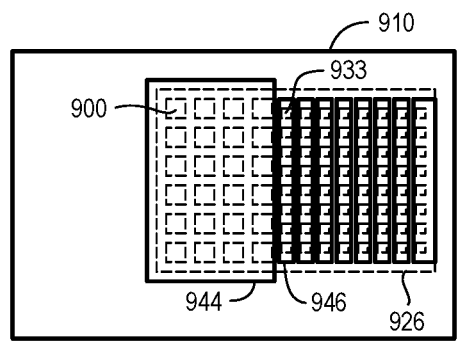

FIG. 8D shows a patterning of a plate layer into a SRAM plate 844 and a number of RRAM plate elements (one shown as 846). Each RRAM plate element (e.g., 846) can be driven separately to different voltages to enable programmable resistance elements in the RRAM cells to be selected for programming or reading operations. In contrast, first plate layer 840 can provide a conductive connection to programmable resistance elements in all SRAM cells, enabling terminals pull-up resistors in such cells to be maintained at a same voltage while storing data in the SRAM cells.

FIG. 9A to 9D are a series of top plan views showing methods of fabricating an IC device according to another embodiment. In FIGS. 9A to 9D, structures to those of FIGS. 8A to 8D are shown by the same reference character but with the leading digit being a "9".

Figure 9B:
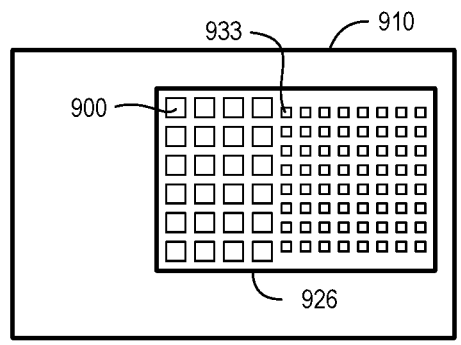

FIGS. 9A to 9D differ from FIGS. 8A to 8D in that there can be one active area 926 in which both SRAM cells (one shown as 900) and RRAM cells (one shown as 933) can be fabricated in (FIG. 9B). That is, SRAM cells and RRAM cells can both be formed of transistors of a same conductivity type. A plate layer 940 can be patterned as described for FIG. 8D, providing a common SRAM plate 944 and separate RRAM plate elements (e.g., 946).

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
   a plurality of static random access memory (SRAM) cells, each SRAM cell including
   a pair of latching devices having controllable current paths connected to first and second data latching nodes, and control terminals cross-coupled between the first and second data latching nodes, and
   first and second resistive elements disposed over the latching devices, the first resistive element conductively connected to the first data latching node by a first vertical connection, the second resistive element conductively connected to the second data latching node by a second vertical connection; wherein
   each resistive element comprises at least one memory layer that is configured to be programmed between at least a high and lower resistance state by application of electric fields, the resistive elements having only the high resistance state to enable the storing of data in a volatile manner in the SRAM cells.

2. The IC device of claim 1, wherein
   the resistive elements for the SRAM cells are fabricated in the high resistance state, and never programmed to the lower resistance state.

3. The IC device of claim 1, wherein
the resistive elements for the SRAM cells are initially programmed to the high resistance state, and not subsequently programmed to the lower resistance state.

4. The IC device of claim 1, wherein
the resistive elements of the plurality of SRAM cells include a contiguous memory layer common to all of the SRAM cells.

5. The IC device of claim 1, further including
a common conductive plate layer in contact with the at least one memory layer of the resistive elements for the plurality of SRAM cells.

6. The IC device of claim 1, wherein
the first and second vertical connections include portions of a plurality of metallization patterns formed at different vertical levels above a substrate of the IC device.

7. The IC device of claim 1, further including:
a plurality of resistive memory cells, each resistive memory cell including at least one memory access device having a control terminal coupled to a memory word line and a controllable current path coupled between a storage node and a memory bit line, and
a memory resistive element disposed over the at least one memory access device, the resistive memory element being conductively connected to the storage node by a third vertical connection; wherein
each memory resistive element comprises the at least one memory layer, the memory resistive elements being programmed between the at least high and lower resistance state to store data in a nonvolatile manner.

8. An integrated circuit (IC) device, comprising:
a static random access memory (SRAM) array comprising a plurality of SRAM cells, each SRAM cell including
a pair of cross-coupled latching devices formed in a substrate and configured to store complementary data values at first and second latching nodes, and
first and second resistive elements disposed over the substrate and conductively connected to the first and second latching nodes by first and second vertical connections, respectively, each resistive element including at least one memory layer; and
a resistive random access memory (RRAM) array comprising a plurality of RRAM cells, each RRAM cell including
at least one storage element disposed over the substrate and conductively connected to a storage node by a third vertical connection, each storage element including the at least one memory layer, and
an access device formed in the substrate and configured to conductively couple the storage node to an RRAM bit line; wherein
the at least one memory layer is configured to be re-programmed between at least a high resistance state and a lower resistance state by application of electric fields, the memory layer of the SRAM cells being maintained in the high resistance state, the memory layer of the RRAM cell storage elements being programmed between at least the high and lower resistance states to store data in the RRAM cells.

9. The IC device of claim 8, wherein
the at least one memory layer of the SRAM cells and RRAM cells is fabricated in the high resistance state, and the memory layer of the SRAM cells is never programmed to the lower resistance state.

10. The IC device of claim 8, wherein
the at least one memory layer of the SRAM cells is initially programmed to the high resistance state, and not subsequently programmed to the lower resistance state.

11. The IC device of claim 8, wherein SRAM array and RRAM array are formed in at least one well formed in the substrate.

12. The IC device of claim 11, wherein SRAM array and RRAM array are formed in the same well.

13. The IC device of claim 8, wherein:
the SRAM cells each include a plurality of SRAM transistors, all of the same conductivity type; and
the RRAM cells each include at least one RRAM transistor of the same conductivity type as the SRAM transistors.

14. The IC device of claim 8, wherein the memory layer of the SRAM cells is a contiguous structure across a plurality of SRAM cells.

15. A method, comprising:
forming pairs of latching devices in a substrate for static random access memory (SRAM) cells, the latching devices having controllable current paths connected to first and second latching nodes, and control terminals cross-coupled between the first and second data latching nodes;
forming a plurality of interconnect layers over the substrate, the interconnect layers forming conductive first vertical connections to each first latching node, and [a] conductive second vertical connections to each second latching node; and
forming at least one memory layer over and in contact with the first and second vertical connections to create first SRAM resistive elements having a conductive connection to each first vertical connection, and second SRAM resistive elements having a conductive connection to each second vertical connection; wherein
the at least one memory layer is configured to be re-programmed between at least a high and lower resistance state by application of electric fields, the first and second SRAM resistive elements having only the high resistance state to enable the storing of data in a volatile manner in the SRAM cells.

16. The method of claim 15, wherein
the at least one memory layer of the SRAM resistive elements is fabricated in the high resistance state and is never programmed to the lower resistance state.

17. The method of claim 15, wherein
the at least one memory layer of the SRAM cells is initially programmed to the high resistance state, and not subsequently programmed to the lower resistance state.

18. The method of claim 15, further including:
forming access devices in the substrate for resistive random access memory (RRAM) cells, the access devices having controllable current paths connected between a storage node and a bit line, and a control terminal coupled to a word line; and
forming the plurality of interconnect layers further includes forming corresponding conductive third vertical connections to each storage node; and
forming the at least one memory layer over and in contact with the third vertical connections to create programmable conductive bridging random access memory (CBRAM) resistive elements having a conductive connection to each third vertical connection; wherein the at least one memory layer of the RRAM cells is programmed between at least the high and lower resistance states to store data in the RRAM cells.

19. The method of claim 18, wherein:

forming the latching devices includes forming latching transistors of a first conductivity type in an integrated circuit substrate; and forming the access devices includes forming access transistors of the first conductivity type in the integrated circuit substrate.

20. The method of claim 19, further including:

forming a well of the second conductivity in the integrated circuit substrate;

forming the latching transistors in the well; and forming the access transistors in the well.

\* \* \* \* \*